(12) United States Patent
Moriguchi et al.

(10) Patent No.: US 9,377,644 B2
(45) Date of Patent: Jun. 28, 2016

(54) DISPLAY DEVICE

(75) Inventors: Masao Moriguchi, Osaka (JP); Yohsuke Kanzaki, Osaka (JP); Yudai Takanishi, Osaka (JP); Takatsugu Kusumi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 65 days.

(21) Appl. No.: 14/006,479

(22) PCT Filed: Mar. 16, 2012

(86) PCT No.: PCT/JP2012/056828
§ 371 (c)(1),
(2), (4) Date: Sep. 20, 2013

(87) PCT Pub. No.: WO2012/132953
PCT Pub. Date: Oct. 4, 2012

(65) Prior Publication Data
US 2014/0009706 A1 Jan. 9, 2014

(30) Foreign Application Priority Data
Mar. 25, 2011 (JP) .................. 2011-067624

(51) Int. Cl.
*G02F 1/1333* (2006.01)
*G02F 1/1339* (2006.01)
(Continued)

(52) U.S. Cl.
CPC ........ *G02F 1/133345* (2013.01); *G02F 1/1339* (2013.01); *G02F 1/136277* (2013.01);
(Continued)

(58) Field of Classification Search
CPC ................ G02F 1/1368; G02F 1/1333; G02F 1/133345; G02F 2001/133357; H01L 29/78606
USPC .............................................. 349/41–43, 122
See application file for complete search history.

(56) References Cited

U.S. PATENT DOCUMENTS 5,407,845 A 4/1995 Nasu et al.
7,298,447 B1 * 11/2007 Zhang .................. G02F 1/1339
349/151

(Continued)

FOREIGN PATENT DOCUMENTS

EP 2 023 194 A1 2/2009
JP 6-310533 A 11/1994
(Continued)

OTHER PUBLICATIONS

Official Communication issued in International Patent Application No. PCT/JP2012/056828, mailed on Apr. 10, 2012.
(Continued)

*Primary Examiner* — Dung Nguyen
(74) *Attorney, Agent, or Firm* — Keating & Bennett, LLP

(57) ABSTRACT

A TFT 1 is formed on a glass substrate 11, and a flattening resin film 17 covering the TFT 1 is formed. Furthermore, a moisture-proof protective film 18 covering the entire surface of the flattening resin film 17 is formed. For the protective film 18, a $SiO_2$ film, a SiN film, a SiON film, or a stacked film thereof is used. The edge surfaces of the flattening resin film 17 are disposed on the inner side of or under a seal 4, and are formed in a tapered shape. By this, the entry of moisture into the flattening resin film 17 is prevented, preventing display degradation. This effect becomes noticeable in a display device including an oxide semiconductor TFT.

10 Claims, 9 Drawing Sheets

(51) Int. Cl.
  *G02F 1/1362* (2006.01)
  *H01L 29/786* (2006.01)
  *G02F 1/1345* (2006.01)
  *G02F 1/1368* (2006.01)
  *G02F 1/1343* (2006.01)
  *H01L 27/12* (2006.01)

(52) U.S. Cl.
  CPC ........ *H01L29/78606* (2013.01); *G02F 1/1345* (2013.01); *G02F 1/1368* (2013.01); *G02F 2001/133311* (2013.01); *G02F 2001/133357* (2013.01); *G02F 2001/134372* (2013.01); *G02F 2201/501* (2013.01); *H01L 27/1248* (2013.01); *H01L 29/78636* (2013.01)

(56) References Cited

U.S. PATENT DOCUMENTS

| | | | |
|---|---|---|---|
| 7,403,237 B2 * | 7/2008 | Iki | 349/43 |
| 7,697,840 B2 * | 4/2010 | Kurosawa | 396/384 |
| 2001/0022362 A1 | 9/2001 | Hayashi | |
| 2007/0222907 A1 | 9/2007 | Onogi et al. | |
| 2009/0201455 A1 | 8/2009 | Murai | |
| 2010/0002173 A1 * | 1/2010 | Otani et al. | 349/114 |
| 2010/0002178 A1 | 1/2010 | Ninomiya et al. | |
| 2010/0134740 A1 | 6/2010 | Nakao | |
| 2010/0157226 A1 | 6/2010 | Sakurai et al. | |
| 2010/0238098 A1 | 9/2010 | Watanabe | |
| 2010/0244029 A1 | 9/2010 | Yamazaki et al. | |
| 2013/0070192 A1 * | 3/2013 | Ide | G02F 1/1339 349/153 |
| 2013/0148072 A1 * | 6/2013 | Jang et al. | 349/150 |

FOREIGN PATENT DOCUMENTS

| | | |
|---|---|---|
| JP | 10-232404 A | 9/1998 |
| JP | 2001-267578 A | 9/2001 |
| JP | 2006-243393 A | 9/2006 |
| WO | 2009/072226 A1 | 6/2009 |

OTHER PUBLICATIONS

Lee, M.; "Study of Amorphous Indium Gallium Zinc Oxide TFT Characteristic for Display Performance Enhancement"; Department of Semiconductor and Display Engineering; Oct. 2010; 88 pages.

* cited by examiner

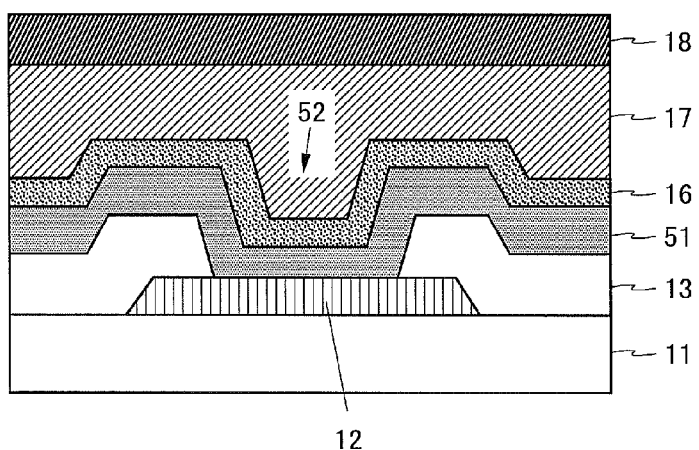
Fig. 6
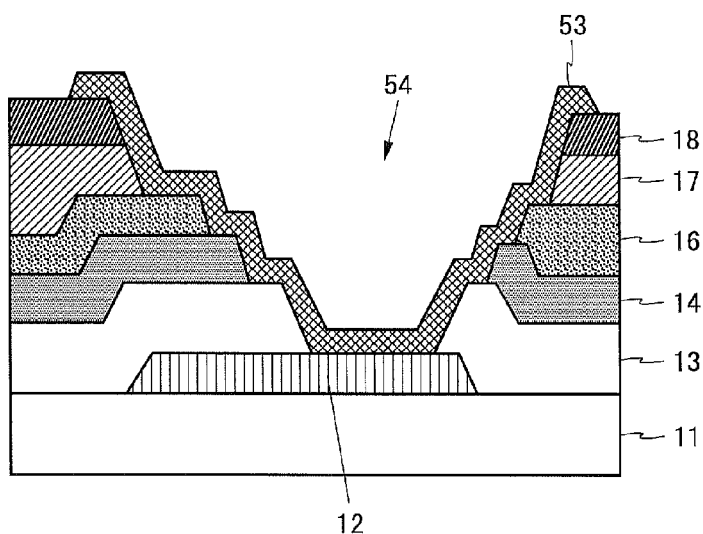
Fig. 7
Fig. 8
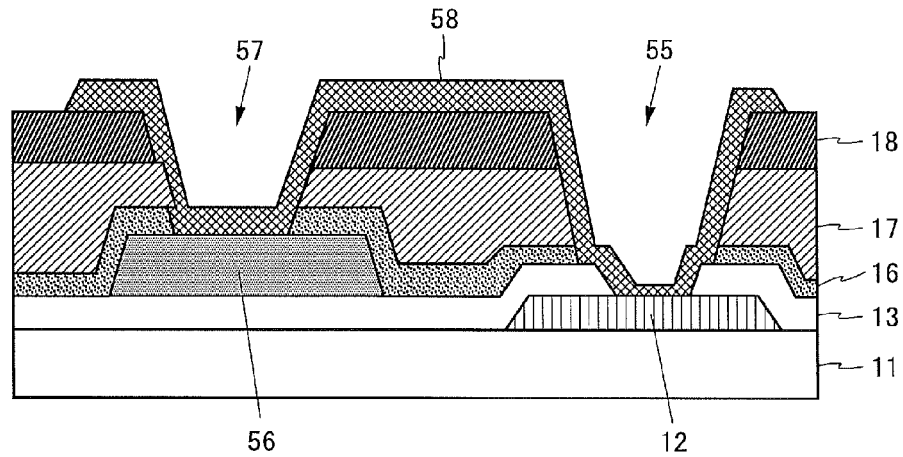

DISPLAY DEVICE

TECHNICAL FIELD

The present invention relates to a display device such as a liquid crystal display device.

BACKGROUND ART

In recent years, liquid crystal display devices have been used in various fields and have been used under various environments. Liquid crystal display devices are also used, for example, under a high temperature and humidity environment. However, when a liquid crystal display device is used under a high temperature and humidity environment, characteristics of a thin film transistor (hereinafter, referred to as a TFT) changes due to the influence of moisture that enters inside the device, which may cause display degradation.

FIG. 16 is a cross-sectional view of a conventional liquid crystal display device. The liquid crystal display device shown in FIG. 16 has a structure in which a TFT substrate 81 and a counter substrate 82 are bonded together and a liquid crystal 83 is filled between the two substrates. A seal 84 is provided around a portion where the two substrates face each other. The TFT substrate 81 is obtained by forming a TFT 86 on a glass substrate 85 and forming a protective film 87 and a flattening film 88 thereon.

For the flattening film 88, for example, an acrylic resin film is used. However, the flattening film 88 made of an acrylic resin has high moisture absorption properties. Due to this, when the liquid crystal display device is used under a high temperature and humidity environment, moisture in the air enters the flattening film 88 from the neighborhood of the seal 84 (see arrow A1). The moisture that enters spreads out in the flattening film 88 and reaches near the TFT 86. Although the TFT 86 is covered with the protective film 87, since a surface of the TFT 86 is uneven, it is difficult to completely cover the TFT 86 with the protective film 87. Hence, the moisture may pass through the protective film 87 and reach an interface between the protective film 87 and a semiconductor layer 89. At this time, characteristics of the TFT 86 greatly changes due to the influence of the moisture.

Patent Document 1 describes liquid crystal display devices for solving this problem (see FIGS. 17 and 18). In a liquid crystal display device shown in FIG. 17, the edge surfaces of a flattening film 91 are covered with a seal 92. In a liquid crystal display device shown in FIG. 18, the edge surfaces of a flattening film 91 are covered with a protective film 95. As such, Patent Document 1 describes the liquid crystal display devices configured to prevent direct contact of the flattening film 91 with air.

PRIOR ART DOCUMENT

Patent Document

[Patent Document 1] Japanese Laid-Open Patent Publication No. 10-232404

SUMMARY OF THE INVENTION

Problems to be Solved by the Invention

However, in the liquid crystal display device shown in FIG. 17, moisture is likely to enter from an interface between the seal 92 and a gate insulating film 93 (see arrow A2). In the liquid crystal display device shown in FIG. 18, moisture is likely to enter from an interface between a seal 92 and the protective film 95 (see arrow A3). When moisture that enters from those interfaces reaches the flattening film 91, the moisture spreads out in the flattening film 91 and easily reaches near a TFT 94. Therefore, the liquid crystal display devices cannot sufficiently prevent display degradation caused by moisture absorption of the flattening film.

An object of the present invention is therefore to provide a display device capable of preventing display degradation caused by moisture absorption of a flattening film.

Means for Solving the Problems

According to a first aspect of the present invention, there is provided a display device having a structure in which two substrates are bonded together, the display device including, a first substrate including a thin film transistor formed on an insulating substrate; and a flattening film covering the thin film transistor; and a second substrate disposed facing the first substrate, wherein the first substrate further includes a moisture-proof protective film covering an entire surface of the flattening film.

According to a second aspect of the present invention, in the first aspect of the present invention, the display device further includes a seal provided around a portion where the first and second substrates face each other, wherein an edge surface of the flattening film is disposed within a region surrounded by the seal, or under the seal.

According to a third aspect of the present invention, in the second aspect of the present invention, the edge surface of the flattening film has a tapered shape.

According to a fourth aspect of the present invention, in the second aspect of the present invention, the first substrate further includes a pixel electrode provided on an opposite side of the protective film from the flattening film; and a contact portion electrically connecting the pixel electrode to an electrode of the thin film transistor, and the protective film is formed on a side surface of the contact portion.

According to a fifth aspect of the present invention, in the second aspect of the present invention, the first substrate further includes a first electrode provided on one surface side of the protective film and electrically connected to an electrode of the thin film transistor; and a second electrode provided on the other surface side of the protective film and electrically connected to a common wiring line.

According to a sixth aspect of the present invention, in the fifth aspect of the present invention, the first electrode has a slit shape.

According to a seventh aspect of the present invention, in the second aspect of the present invention, the protective film is any one of a $SiO_2$ film, a SiN film, a SiON film, and a stacked film thereof.

According to an eighth aspect of the present invention, in the second aspect of the present invention, the thin film transistor has a semiconductor layer formed of an oxide semiconductor.

According to a ninth aspect of the present invention, in the second aspect of the present invention, the thin film transistor has a semiconductor layer formed of either one of amorphous silicon and crystalline silicon.

According to a tenth aspect of the present invention, in the second aspect of the present invention, the flattening film is a resin film.

Effects of the Invention

According to the first aspect of the present invention, since the protective film is provided on a flat surface, the covering properties of the flattening film are enhanced. Therefore, by covering the entire surface of the flattening film using the protective film having moisture-proof properties, the entry of moisture into the flattening film is prevented, enabling to prevent display degradation caused by moisture absorption of the flattening film.

According to the second aspect of the present invention, by disposing an edge surface of the flattening film within the region surrounded by the seal or under the seal, direct contact of the edge surface of the flattening film with air is prevented, enabling to more effectively prevent display degradation caused by moisture absorption of the flattening film.

According to the third aspect of the present invention, by forming an edge surface of the flattening film in a tapered shape, the covering properties of the edge surface of the flattening film are enhanced, enabling to more effectively prevent display degradation caused by moisture absorption of the flattening film.

According to the fourth aspect of the present invention, by also forming the moisture-proof protective film on a side surface of the contact portion, the number of moisture entry paths into the flattening film is reduced, enabling to more effectively prevent display degradation caused by moisture absorption of the flattening film.

According to the fifth aspect of the present invention, by sandwiching the protective film provided for moisture prevention by two electrodes, a capacitance is formed. The formed capacitance can be used as an auxiliary capacitance. In addition, by forming the two electrodes to be transparent electrodes, the auxiliary capacitance is allowed to have light transmission properties, enabling to increase the aperture ratio of a display element.

According to the sixth aspect of the present invention, by forming the first electrode in a slit shape, a fringing field can be produced. Therefore, in a liquid crystal display device, the alignment of a liquid crystal is controlled using the produced fringing field, by which viewing angle characteristics can be improved.

According to the seventh aspect of the present invention, by using, as the protective film, a $SiO_2$ film, a SiN film, a SiON film or a stacked film thereof that has moisture-proof properties, the entry of moisture into the flattening film is prevented, enabling to prevent display degradation caused by moisture absorption of the flattening film. This effect becomes noticeable when using a SiN film or SiON film that has high moisture-proof properties.

According to the eighth aspect of the present invention, in a display device including an oxide semiconductor TFT whose characteristics greatly changes when subjected to the influence of moisture, display degradation caused by moisture absorption of the flattening film can be prevented.

According to the ninth aspect of the present invention, in a display device including an amorphous silicon TFT or a crystalline silicon TFT, display degradation caused by moisture absorption of the flattening film can be prevented.

According to the tenth aspect of the present invention, even when a flattening film made of a resin and having high moisture absorption properties is used, by covering the entire surface of the flattening film using a protective film having moisture-proof properties, the entry of moisture into the flattening film is prevented, enabling to prevent display degradation caused by moisture absorption of the flattening film.

BRIEF DESCRIPTION OF THE DRAWINGS

FIG. 6 is a cross-sectional view showing a first exemplary configuration of a contact portion of the liquid crystal display device shown in FIG. 1.
FIG. 7 is a cross-sectional view showing a second exemplary configuration of a contact portion of the liquid crystal display device shown in FIG. 1.
FIG. 8 is a cross-sectional view showing a third exemplary configuration of contact portions of the liquid crystal display device shown in FIG. 1.

MODES FOR CARRYING OUT THE INVENTION

First Embodiment

Figure 1:
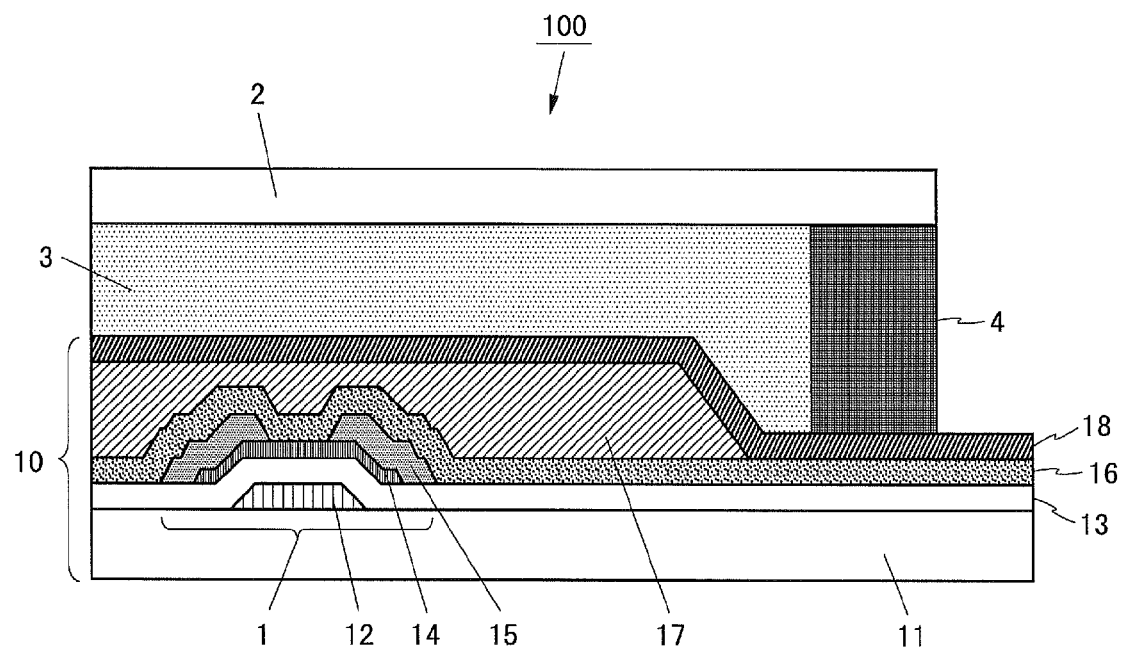
FIG. 1 is a cross-sectional view of a liquid crystal display device according to a first embodiment of the present invention.

FIG. 1 is a cross-sectional view of a liquid crystal display device according to a first embodiment of the present invention. A liquid crystal display device 100 shown in FIG. 1 has a structure in which a TFT substrate 10 and a counter substrate 2 are bonded together and a liquid crystal 3 is filled between the two substrates. The TFT substrate 10 and the counter substrate 2 are disposed facing each other, and a seal 4 made of a resin is provided around a portion where the two substrates face each other. The counter substrate 2 is provided with a counter electrode, a color filter (none of which are shown), etc.

On the TFT substrate 10, a TFT 1 and various types of wiring lines (gate wiring lines, data wiring lines, etc.) are formed. The TFT 1 is formed by forming in turn a gate electrode 12, a gate insulating film 13, a semiconductor layer 14, and a source/drain electrode 15 on a glass substrate 11. On the substrate obtained after forming the TFT 1, a protective film 16, a flattening film 17 made of a resin (hereinafter, referred to as the flattening resin film), and a protective film 18 having moisture-proof properties are formed in turn.

The protective film 16 is provided to prevent direct contact of the TFT 1 with the flattening resin film 17 to protect the TFT 1. The flattening resin film 17 is provided to flatten a surface of the substrate. The edge surfaces of the flattening resin film 17 are provided within a region surrounded by the seal 4 (hereinafter, referred to as the inner side of the seal 4). The size of the flattening resin film 17 increases as approaching the glass substrate 11, and the edge surfaces of the flattening resin film 17 have a tapered shape. The protective film 18 is provided to cover the entire surface of the flattening resin film 17 so as to prevent the entry of moisture into the flattening resin film 17.

The gate electrode 12 and the source/drain electrode 15 are formed using, for example, Cu/Ti or the like. For the gate insulating film 13, for example, a $SiO_2$ film, a SiN film, or a stacked film thereof is used. The semiconductor layer 14 is formed using, for example, amorphous silicon, crystalline silicon, or an oxide semiconductor such as IGZO (Indium Gallium Zinc Oxide). For the protective film 16, for example, a $SiO_2$ film, a $SiN_x$ film, a SiON film, or a stacked film thereof is used. For the flattening resin film 17, as an easy-to-process resin film having insulation properties and light transmission properties, for example, an acrylic resin film or the like is used. For the protective film 18, for example, a $SiO_2$ film, a SiN film, a SiON film, or a stacked film thereof is used. Note that instead of the glass substrate 11, other insulating substrates may be used.

Figure 2A:
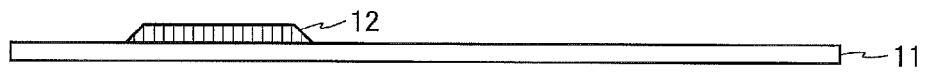
FIG. 2A is a diagram showing a manufacturing process of the liquid crystal display device shown in FIG. 1.
Figure 2B:
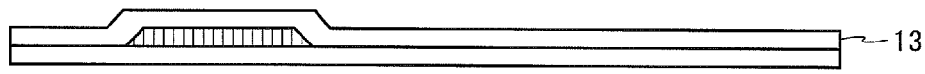
FIG. 2B is a diagram continued from FIG. 2A.
Figure 2C:
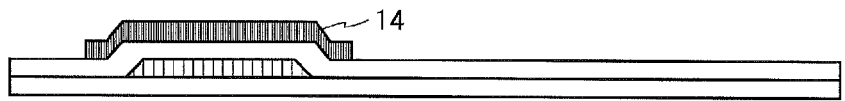
FIG. 2C is a diagram continued from FIG. 2B.
Figure 2D:
FIG. 2D is a diagram continued from FIG. 2C.
Figure 2E:
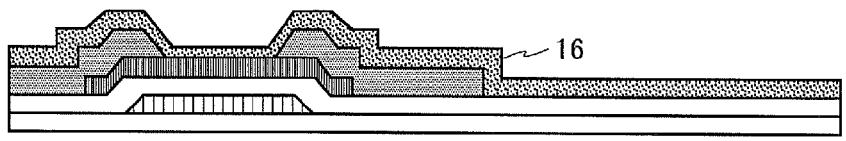
FIG. 2E is a diagram continued from FIG. 2D.
Figure 2F:
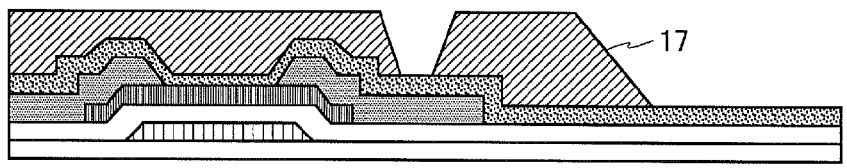
FIG. 2F is a diagram continued from FIG. 2E.

With reference to FIGS. 2A to 2I, a method of manufacturing a liquid crystal display device 100 having a contact portion 5 will be described. To fabricate a TFT substrate 10, first, a gate electrode 12 is formed on a glass substrate 11 using Cu/Ti or the like (FIG. 2A). Then, a $SiO_2$ film, a SiN film, or a stacked film thereof is formed on the substrate, thereby forming a gate insulating film 13 covering a surface of the substrate (FIG. 2B). Then, using amorphous silicon, crystalline silicon, or an oxide semiconductor (e.g., IGZO), a semiconductor layer 14 is formed above the gate electrode 12 (FIG. 2C). For example, when the semiconductor layer 14 is formed using an oxide semiconductor, a sputtering method is used. Then, a source/drain electrode 15 which comes into contact with the semiconductor layer 14 is formed on the substrate using Cu/Ti or the like (FIG. 2D). Then, a $SiO_2$ film, a $SiN_x$ film, a SiON film, or a stacked film thereof is formed on the substrate, thereby forming a protective film 16 covering the entire surface of the substrate (FIG. 2E). Then, a flattening resin film 17 which covers the entire surface of the substrate is formed using an acrylic resin or the like. Thereafter, by performing direct patterning by a photolithographic process, an opening is formed at a location where a contact portion 5 is to be formed (FIG. 2F).

Figure 2G:
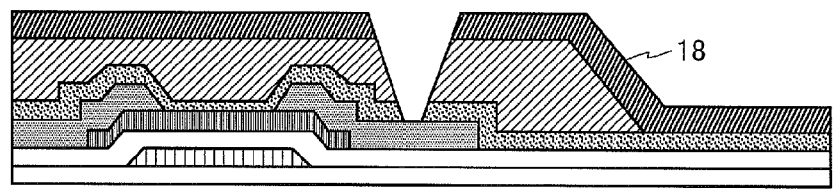
FIG. 2G is a diagram continued from FIG. 2F.
Figure 2H:
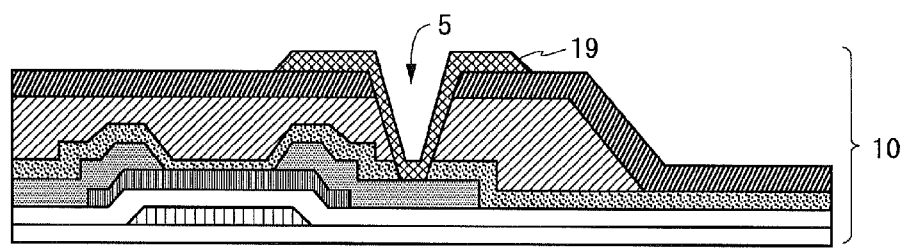
FIG. 2H is a diagram continued from FIG. 2G.

Then, a $SiO_2$ film, a SiN film, a SiON film, or a stacked film thereof is formed on the substrate, thereby forming a protective film 18 which covers the surface of the substrate, including the entire surface of the flattening resin film 17. Thereafter, by a photolithographic process, a contact hole reaching the drain electrode 15 is made at the location where the contact portion 5 is to be formed (FIG. 2G). Then, a transparent conductive film 19 which comes into contact with the drain electrode 15 is formed using ITO (Indium Tin Oxide), IZO (Indium Zinc Oxide), or the like (FIG. 2H). The transparent conductive film 19 is also formed inside the contact hole, thereby forming the contact portion 5. The transparent conductive film 19 formed on the protective film 18 functions as a pixel electrode. The pixel electrode is provided on the opposite side of the protective film 18 from the flattening resin film 17, and the contact portion 5 electrically connects the pixel electrode to the drain electrode 15 of a TFT 1. By the above-described processes, the TFT substrate 10 is completed.

Figure 2I:
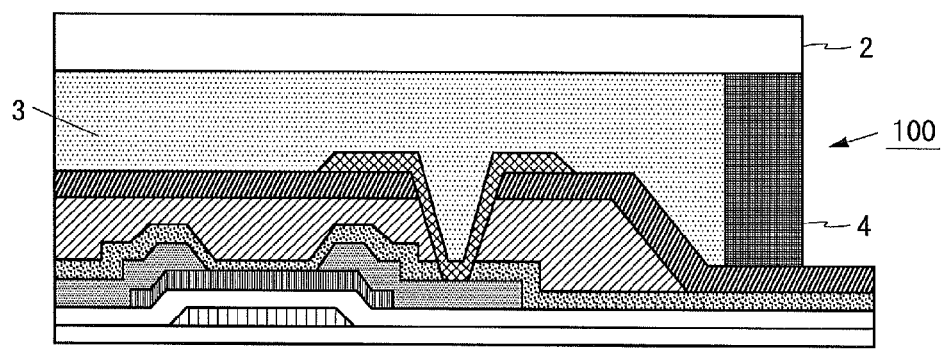
FIG. 2I is a diagram continued from FIG. 2H.

Then, alignment films (not shown) are provided on a surface of the TFT substrate 10 on the side where the TFT 1 is formed, and on a surface of a counter substrate 2 on the side where a counter electrode is formed. Thereafter, the TFT substrate 10 and the counter substrate 2 are disposed facing each other (the surfaces provided with the alignment films face each other), a seal 4 is provided around a portion where the two substrates face each other, the two substrates are bonded together with spacers (not shown) interposed therebetween, and a liquid crystal 3 is filled between the two substrates (FIG. 2I). At this time, the edge surfaces of the flattening resin film 17 are provided on the inner side of the seal 4. By the above-described processes, the liquid crystal display device 100 is completed.

The effects of the liquid crystal display device 100 according to the present embodiment will be described below. As described above, in the conventional liquid crystal display devices, display degradation caused by moisture absorption of a flattening film may become problematic. To solve this problem, the moisture-proof protective film 18 covering the entire surface of the flattening resin film 17 is provided to the TFT substrate 10 of the liquid crystal display device 100. The edge surfaces of the flattening resin film 17 are disposed on the inner side of the seal 4 and have a tapered shape.

As such, in the liquid crystal display device 100, since the protective film 18 is provided on a flat surface, the covering properties of the flattening resin film 17 are enhanced. Hence, even when moisture in the air enters inside the liquid crystal display device 100, the entry of the moisture into the flattening resin film 17 can be prevented. By this, the moisture is prevented from reaching an interface between the semiconductor layer 14 and the protective film 16, enabling to prevent characteristics of the TFT 1 from changing due to the influence of the moisture. Therefore, according to the liquid crystal display device 100, display degradation caused by moisture absorption of the flattening resin film 17 can be prevented.

In addition, since the edge surfaces of the flattening resin film 17 are disposed on the inner side of the seal 4, direct contact of the edge surfaces of the flattening resin film 17 with air does not occur. Since the seal 4 made of a resin has moisture-proof properties, the amount of moisture that enters the device can be reduced by the moisture-proof effect of the seal 4. By thus disposing the edge surfaces of the flattening resin film 17 on the inner side of the seal 4, direct contact of the edge surfaces of the flattening resin film 17 with air is prevented, enabling to more effectively prevent display degradation caused by moisture absorption of the flattening resin film 17.

In addition, by forming the edge surfaces of the flattening resin film 17 in a tapered shape, the covering properties of the edge surfaces of the flattening resin film 17 can be enhanced. By this, the entry of moisture into the flattening resin film 17 is more effectively prevented, enabling to more effectively prevent display degradation caused by moisture absorption of the flattening resin film 17.

Figure 3:
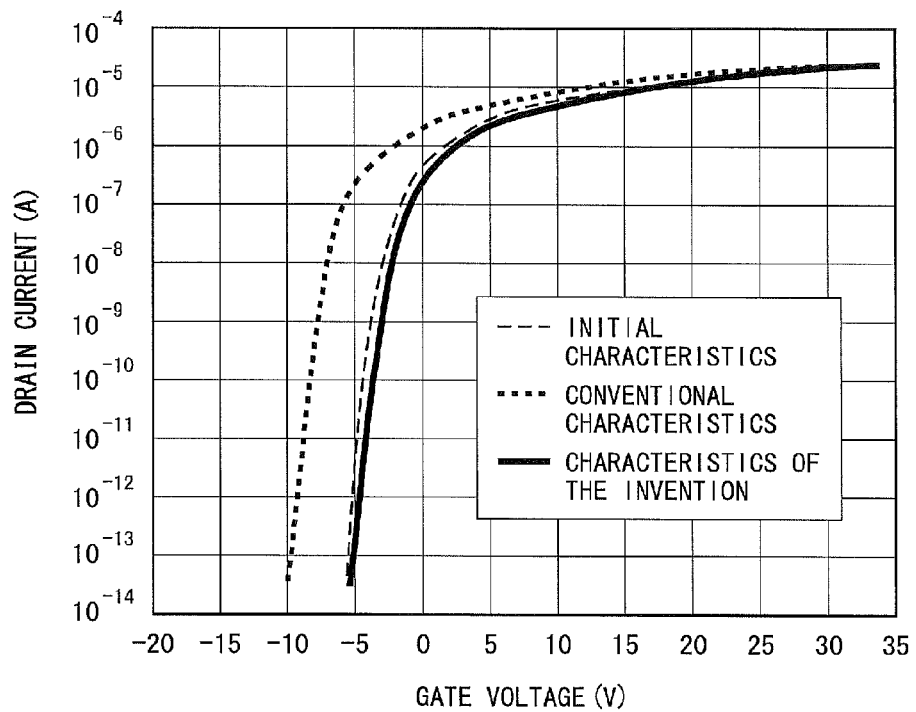
FIG. 3 is a diagram showing an example of changes in characteristics of an oxide semiconductor TFT.

FIG. 3 is a diagram showing an example of changes in characteristics of an oxide semiconductor TFT. In FIG. 3, the horizontal axis represents a gate voltage, and the vertical axis represents a drain current. FIG. 3 describes, for a given oxide semiconductor TFT, initial characteristics (thin dashed line), characteristics obtained after a lapse of 2,000 hours in a conventional liquid crystal display device (thick dashed line), and characteristics obtained after a lapse of 2,000 hours in the liquid crystal display device 100 according to the present embodiment (thick solid line).

In the conventional liquid crystal display device, since a flattening film made of a resin absorbs moisture in the air, the characteristics of the oxide semiconductor TFT greatly changes from the initial characteristics after a lapse of 2,000 hours. Due to this, display degradation occurs in the conventional liquid crystal display device including the oxide semiconductor TFT. On the other hand, in the liquid crystal display device 100, since the flattening resin film 17 does not absorb moisture in the air, the characteristics of the oxide semiconductor TFT does not change almost at all from the initial characteristics even after a lapse of 2,000 hours. As can be seen from this example, according to the liquid crystal display device 100, display degradation caused by moisture absorption of a flattening film can be prevented.

For the protective film 18, for example, a $SiO_2$ film, a SiN film, a SiON film, or a stacked film thereof can be used. Of them, a SiN film and a SiON film have high moisture-proof properties. Thus, in a liquid crystal display device including a SiN film or a SiON film as the protective film 18, the above-described effects become noticeable.

In addition, of an amorphous silicon TFT, a crystalline silicon TFT, and an oxide semiconductor TFT, characteristics of the oxide semiconductor TFT greatly changes when subjected to the influence of moisture. Therefore, in a liquid crystal display device including an oxide semiconductor TFT, the above-described effects become noticeable.

Note that although in the liquid crystal display device 100 the edge surfaces of the flattening resin film 17 are disposed on the inner side of the seal 4, the edge surfaces of the flattening resin film 17 may be disposed under the seal 4. Even when the edge surfaces of the flattening resin film 17 are provided under the seal 4, the same effects as those obtained when the edge surfaces of the flattening resin film 17 are provided on the inner side of the seal 4 can be obtained. In addition, if sufficient effects can be obtained only with the protective film 18, then the edge surfaces of the flattening resin film 17 may be disposed outside the region surrounded by the seal 4.

In addition, although the liquid crystal display device 100 includes the protective film 16, the liquid crystal display device does not necessarily include the protective film 16. The protective film 16 is provided to prevent a reduction in the reliability of the TFT 1 caused by the flattening resin film 17, which is an organic substance, coming into contact with the semiconductor layer 14. By providing the protective film 16, the reliability of the liquid crystal display device 100 can be increased.

Figure 4:
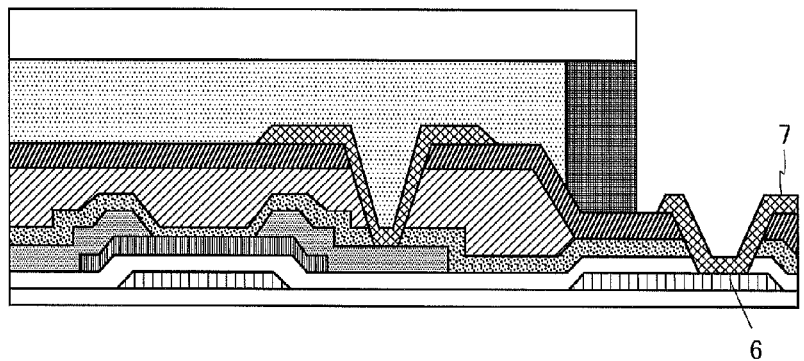
FIG. 4 is a cross-sectional view showing a first exemplary configuration of a terminal portion of the liquid crystal display device shown in FIG. 1.
Figure 5:
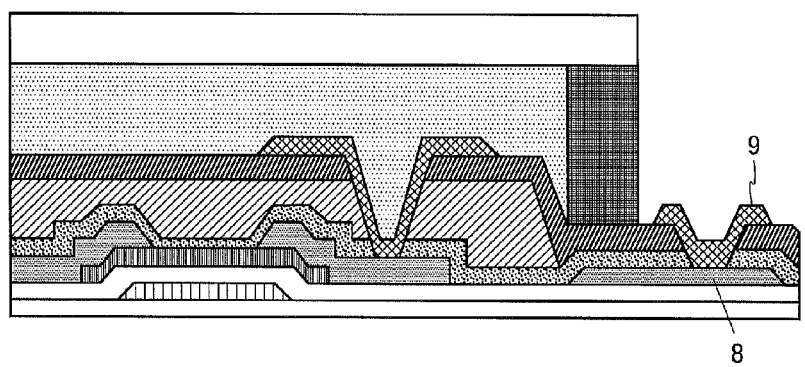
FIG. 5 is a cross-sectional view showing a second exemplary configuration of a terminal portion of the liquid crystal display device shown in FIG. 1.

The configurations of a terminal portion and a contact portion of the liquid crystal display device 100 will be described below. When a gate electrode is used as a terminal, an opening that reaches the gate electrode is formed. When the gate electrode is formed of a corrosive metal, by providing, as shown in FIG. 4, a transparent electrode 7 covering a gate electrode 6, the reliability of the terminal can be increased. Likewise, when a source electrode is used as a terminal, an opening that reaches the source electrode is formed. When the source electrode is formed of a corrosive metal, by providing, as shown in FIG. 5, a transparent electrode 9 covering a source electrode 8, the reliability of the terminal can be increased.

For a contact portion that connects a gate electrode to a source electrode, the following configurations are considered. In a first exemplary configuration (FIG. 6), an opening is formed in a gate insulating film 13, and a source wiring line 51 is disposed in the opening portion. By this, a contact portion 52 that connects a gate electrode 12 to a source electrode is formed.

In a second exemplary configuration (FIG. 7), a gate electrode 12 is connected to a source electrode using ITO, IZO, or the like, as with a pixel electrode 53. Since ITO or IZO is deposited by a sputtering method, when a wiring line that connects stages is formed using ITO or IZO, a disconnection caused by step is likely to occur in the wiring line. Hence, an IGZO pattern edge is disposed on the outer side than a pattern edge of a source wiring line, and the size of an opening is made larger as approaching the lower layer. According to this method, a contact portion 54 can be formed only with one opening, and thus, area efficiency can be increased. In addition, since the layers can be patterned and etched all at once, the number of manufacturing processes can be reduced.

In a third exemplary configuration (FIG. 8), a contact 55 for a gate electrode 12 and a contact 57 for a source electrode 56 are formed separately, and the two contacts 55 and 57 are connected to each other using a pixel electrode 58. According to this method, contact portions can be easily formed.

Second Embodiment

Figure 9:
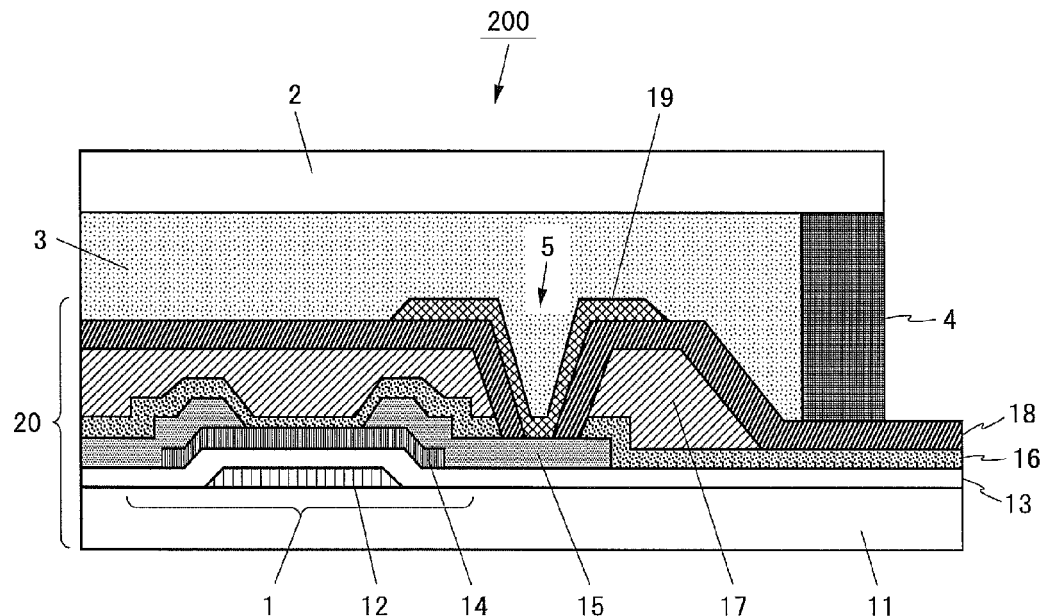
FIG. 9 is a cross-sectional view of a liquid crystal display device according to a second embodiment of the present invention.

FIG. 9 is a cross-sectional view of a liquid crystal display device according to a second embodiment of the present invention. A liquid crystal display device 200 shown in FIG. 9 has a structure in which a TFT substrate 20 and a counter substrate 2 are bonded together and a liquid crystal 3 is filled between the two substrates. Of the components in embodiments shown below, the same components as those in the aforementioned embodiment are denoted by the same reference characters and description thereof is omitted.

As in the first embodiment, the TFT substrate 20 of the liquid crystal display device 200 includes a pixel electrode provided on the opposite side of a protective film 18 from a flattening resin film 17; and a contact portion 5 that electrically connects the pixel electrode to a drain electrode 15 of a TFT 1. In the liquid crystal display device 100 according to the first embodiment, the protective film 18 is not formed on the side surfaces of the contact portion 5 (see FIG. 2I). On the other hand, in the liquid crystal display device 200 according to the present embodiment, the protective film 18 is formed not only on the flattening resin film 17, but also on the side surfaces of the contact portion 5.

To manufacture such a liquid crystal display device 200, a photolithography process needs to be added to the manufacturing processes shown in FIGS. 2A to 2I. Specifically, after forming a protective film 18 on the substrate shown in FIG. 2F, an opening which is a bit smaller than the opening shown in FIG. 2F needs to be patterned in the protective film 18.

According to the liquid crystal display device 200 according to the present embodiment, by also forming the moisture-proof protective film 18 on the side surfaces of the contact portion 5, the number of moisture entry paths into the flattening resin film 17 can be reduced. Accordingly, display degradation caused by moisture absorption of the flattening resin film 17 can be more effectively prevented.

Third Embodiment

Figure 10:
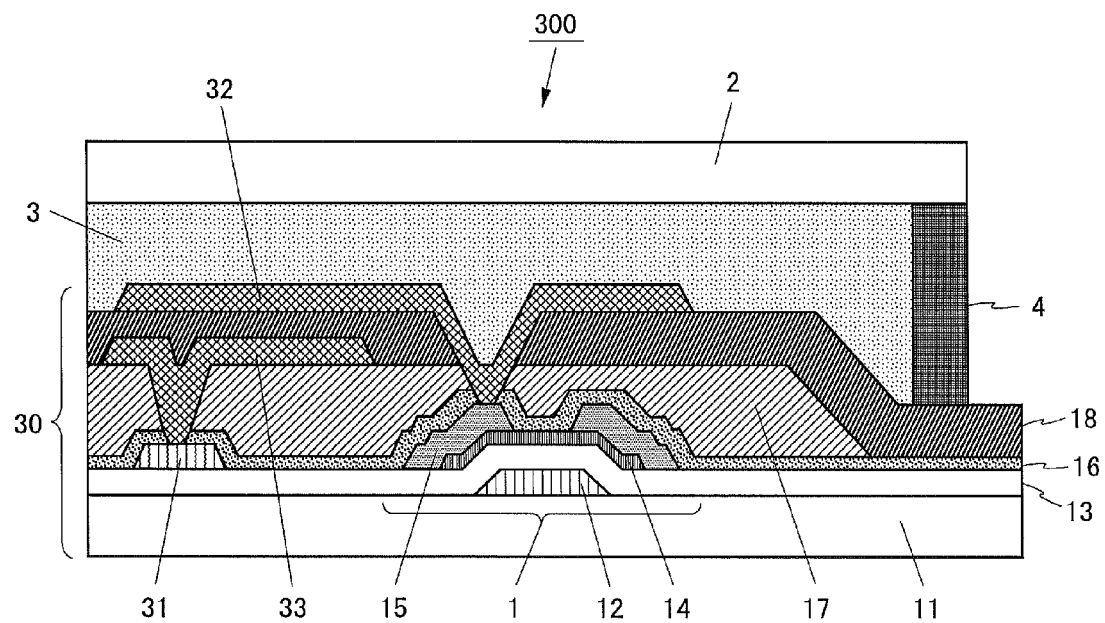
FIG. 10 is a cross-sectional view of a liquid crystal display device according to a third embodiment of the present invention.

FIG. 10 is a cross-sectional view of a liquid crystal display device according to a third embodiment of the present invention. A liquid crystal display device 300 shown in FIG. 10 has a structure in which a TFT substrate 30 and a counter substrate 2 are bonded together and a liquid crystal 3 is filled between the two substrates.

On the substrate obtained after forming a gate insulating film 13, a common wiring line 31 to which a common voltage is applied is formed. A lower layer electrode 33 that is electrically connected to the common wiring line 31 is formed on a flattening resin film 17. A protective film 18 is formed to cover the entire surfaces of the flattening resin film 17 and the lower layer electrode 33. An upper layer electrode 32 that is electrically connected to a drain electrode 15 is formed on the protective film 18 so as to face the lower layer electrode 33 with the protective film 18 interposed therebetween. As such, the TFT substrate 30 includes the upper layer electrode 32 provided on one surface side of the protective film 18 and electrically connected to the drain electrode 15 of a TFT 1; and the lower layer electrode 33 provided on the other surface side of the protective film 18 and electrically connected to the common wiring line 31.

According to the liquid crystal display device 300 according to the present embodiment, by sandwiching the protective film 18 provided for moisture prevention by two electrodes (the upper layer electrode 32 and the lower layer electrode 33), a capacitance is formed. The formed capacitance can be used as an auxiliary capacitance. In addition, by forming the two electrodes to be transparent electrodes, the auxiliary capacitance is allowed to have light transmission properties, enabling to increase the aperture ratio of a display element.

Fourth Embodiment

Figure 11:
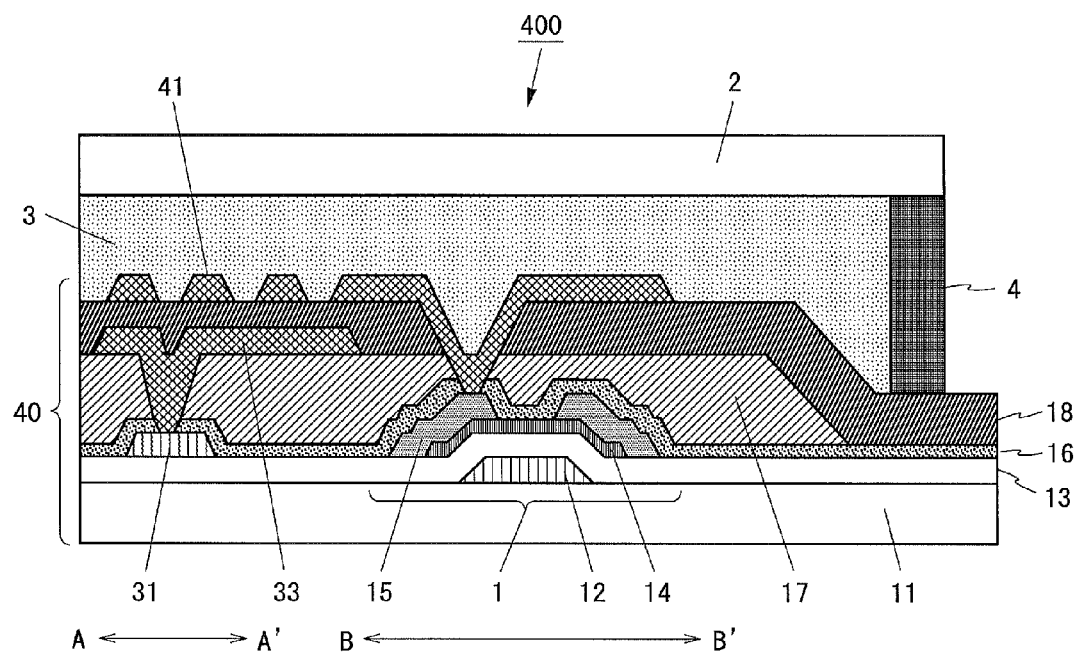
FIG. 11 is a cross-sectional view of a liquid crystal display device according to a fourth embodiment of the present invention.

FIG. 11 is a cross-sectional view of a liquid crystal display device according to a fourth embodiment of the present invention. A liquid crystal display device 400 shown in FIG. 11 has a structure in which a TFT substrate 40 and a counter substrate 2 are bonded together and a liquid crystal 3 is filled between the two substrates.

As in the third embodiment, on the TFT substrate 40 of the liquid crystal display device 400, a common wiring line 31, an upper layer electrode 41, and a lower layer electrode 33 are formed. Note, however, that in the liquid crystal display device 400 the upper layer electrode 41 has a slit shape.

Figure 12:
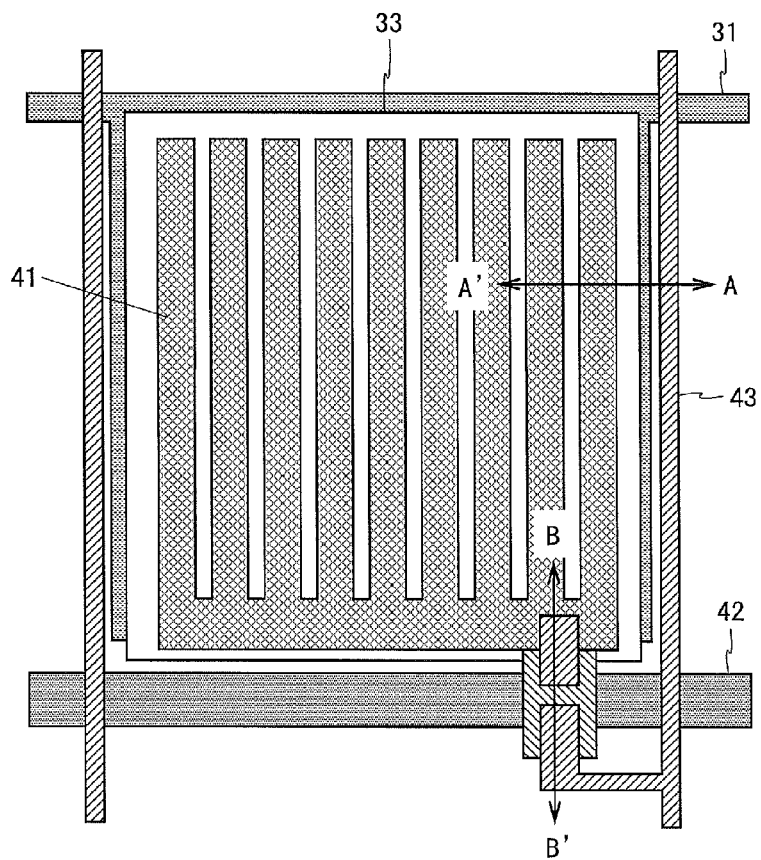
FIG. 12 is a plan view of the liquid crystal display device shown in FIG. 11.

FIG. 12 is a plan view of the liquid crystal display device 400. As shown in FIG. 12, the slit-shaped upper layer electrode 41 and the planar lower layer electrode 33 are overlappingly disposed in a region surrounded by the common wiring line 31, a gate wiring line 42, and data wiring lines 43. The lower layer electrode 33 is connected to the common wiring line 31 to which a common voltage is applied. By this, a fringing field can be formed in the region.

Note that a slit-shaped electrode itself may be used as the upper layer electrode 41, or an electrode that is partly formed in a slit shape may be used as the upper layer electrode 41. Moreover, the lower layer electrode 33 is not provided in a portion corresponding to a portion of the upper layer electrode 41 that does not have a slit shape, and a TN (Twisted Nematic) or vertical alignment liquid crystal mode is used in the portion. By this, a fringe field mode liquid crystal display device with excellent viewing angle characteristics can be configured.

According to the liquid crystal display device 400 according to the present embodiment, by sandwiching a protective film 18 provided for moisture prevention by two electrodes (the upper layer electrode 41 and the lower layer electrode 33), a capacitance can be formed. In addition, by forming the upper layer electrode 41 in a slit shape, a fringing field can be produced. Therefore, the alignment of the liquid crystal is controlled using the produced fringing field, by which viewing angle characteristics can be improved.

Note that the configurations of terminal portions and contact portions of the liquid crystal display devices 200, 300, and 400 according to the second to fourth embodiments are the same as those of the liquid crystal display device 100 according to the first embodiment (see FIGS. 4 to 8).

Note also that although in the first to fourth embodiments a bottom gate, channel etch-type TFT is used, TFTs having other structures may be used. Even when TFTs shown below are used, the same effects as those obtained in the first to fourth embodiments can be obtained.

Figure 13:
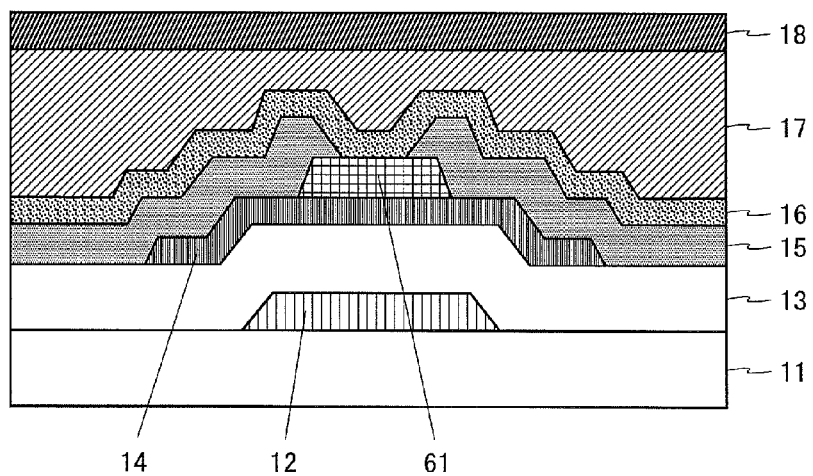
FIG. 13 is a cross-sectional view of a liquid crystal display device including an etch stopper-type TFT, according to a variant of the present invention.

FIG. 13 is a cross-sectional view of a liquid crystal display device including an etch stopper-type TFT. In the TFT shown in FIG. 13, a channel protective film 61 is provided on a channel. In the case of using this structure, although the number of processes increases, damage upon etching is prevented, enabling stable production. In addition, since the channel protective film 61 is present, even if subjected to the influence of moisture, characteristics of the TFT is less likely to change.

Figure 14:
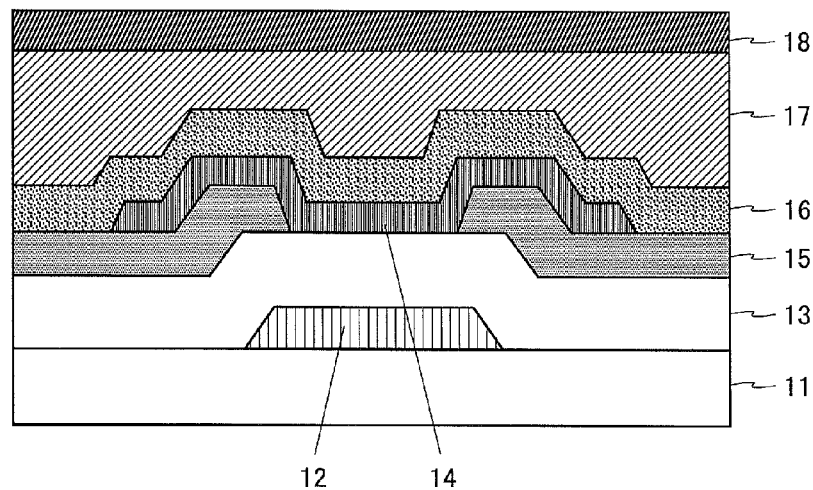
FIG. 14 is a cross-sectional view of a liquid crystal display device including a bottom contact-type TFT, according to a variant of the present invention.

FIG. 14 is a cross-sectional view of a liquid crystal display device including a bottom contact-type TFT. In the TFT shown in FIG. 14, a source/drain electrode 15 is formed on a gate insulating film 13, and a semiconductor layer 14 is formed thereon. In the case of using this structure, the semiconductor layer 14 does not get damage upon channel etching. In addition, since the semiconductor layer 14 and a flattening resin film 17 face each other in a wide area, the effects of the present invention become more noticeable.

Figure 15:
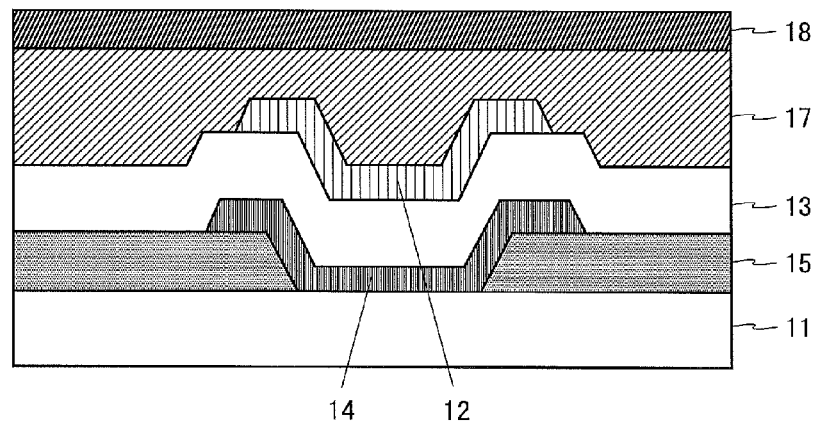
FIG. 15 is a cross-sectional view of a liquid crystal display device including a top gate-type TFT, according to a variant of the present invention.
Figure 16:
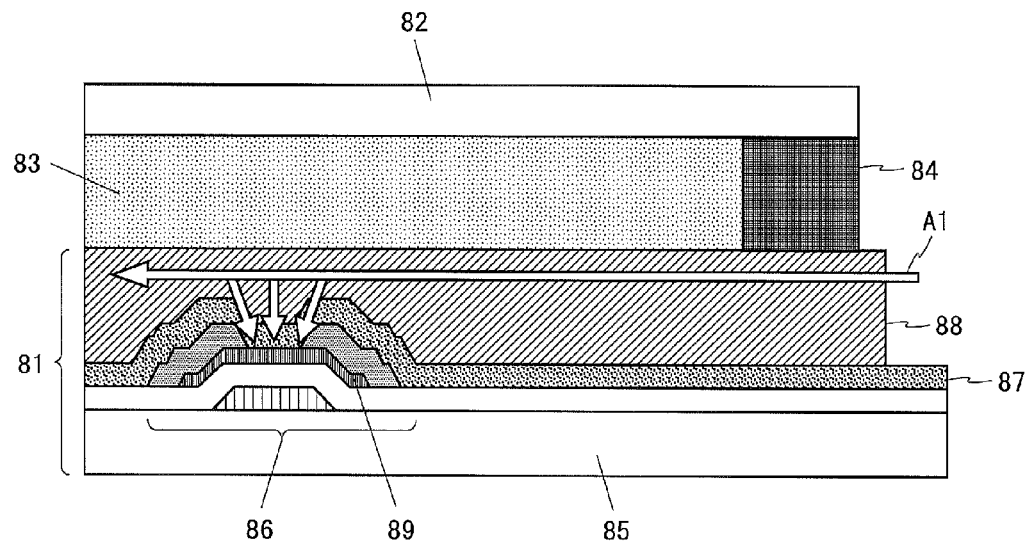
FIG. 16 is a cross-sectional view of a conventional liquid crystal display device.
Figure 17:
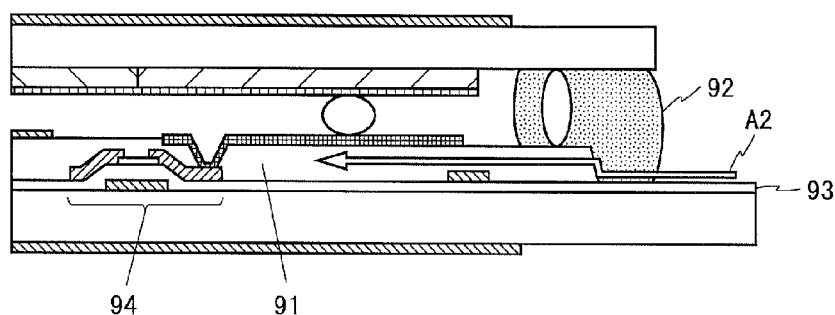
FIG. 17 is a cross-sectional view of a conventional liquid crystal display device.
Figure 18:
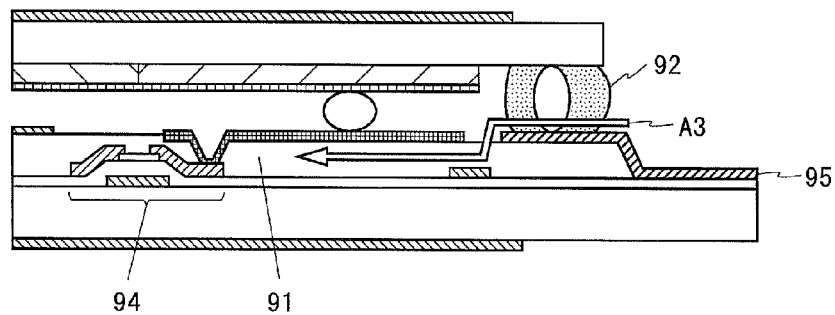
FIG. 18 is a cross-sectional view of a conventional liquid crystal display device.

FIG. 15 is a cross-sectional view of a liquid crystal display device including a top gate-type TFT. When the TFT shown in FIG. 15 is formed, after forming a source/drain electrode 15, a semiconductor layer 14 is formed, and thereafter a gate insulating film 13 and a gate electrode 12 are formed in turn. In the case of using this structure, the semiconductor layer 14 does not get damage upon channel etching. With this structure, too, the effects of the present invention can be obtained.

As described above, according to the display devices of the present invention, display degradation caused by moisture absorption of a flattening film can be prevented.

INDUSTRIAL APPLICABILITY

The display devices of the present invention have a feature that they can prevent display degradation caused by moisture absorption of a flattening film, and thus, can be used as various types of display devices having a structure in which two substrates are bonded together, such as liquid crystal display devices.

DESCRIPTION OF REFERENCE CHARACTERS

1: TFT
2: COUNTER SUBSTRATE
3: LIQUID CRYSTAL
4: SEAL

5: CONTACT PORTION
10, 20, 30, and 40: TFT SUBSTRATE
11: GLASS SUBSTRATE
12: GATE ELECTRODE
13: GATE INSULATING FILM
14: SEMICONDUCTOR LAYER
15: SOURCE/DRAIN ELECTRODE
16 and 18: PROTECTIVE FILM
17: FLATTENING RESIN FILM
19: TRANSPARENT CONDUCTIVE FILM
31: COMMON WIRING LINE
32 and 41: UPPER LAYER ELECTRODE
33: LOWER LAYER ELECTRODE
100, 200, 300, and 400: LIQUID CRYSTAL DISPLAY DEVICE

The invention claimed is:

1. A display device having a structure in which two substrates are bonded together, the display device comprising:
a first substrate including a thin film transistor formed on an insulating substrate; and a flattening film covering the thin film transistor;
a second substrate disposed facing the first substrate; and
a seal provided around a portion where the first and second substrates face each other, wherein
the first substrate further includes a moisture-proof protective film covering an entire surface of the flattening film,
an edge surface of the flattening film is disposed within a region surrounded by the seal, or under the seal,
a portion of the moisture-proof protective film is located immediately under the seal such that the portion of the moisture-proof protective film directly contacts the seal, and
the first substrate further includes a first electrode provided on one surface side of the moisture-proof protective film and electrically connected to an electrode of the thin film transistor, and a second electrode provided on another surface side of the moisture-proof protective film and electrically connected to a common wiring line.

2. The display device according to claim 1, wherein the edge surface of the flattening film has a tapered shape.

3. The display device according to claim 1, wherein
the first electrode is a pixel electrode and includes a contact portion electrically connecting the pixel electrode to an electrode of the thin film transistor, and
the moisture-proof protective film is provided on a side surface of the contact portion.

4. The display device according to claim 1, wherein the first electrode has a slit shape.

5. The display device according to claim 1, wherein the moisture-proof protective film is any one of a $SiO_2$ film, a SiN film, a SiON film, and a stacked film thereof.

6. The display device according to claim 1, wherein the thin film transistor includes a semiconductor layer made of an oxide semiconductor.

7. The display device according to claim 6, wherein the semiconductor layer is made of indium gallium zinc oxide.

8. The display device according to claim 1, wherein the thin film transistor includes a semiconductor layer made of either one of amorphous silicon and crystalline silicon.

9. The display device according to claim 1, wherein the flattening film is a resin film.

10. The display device according to claim 1, wherein
the first substrate further includes a second protective film provided between the thin film transistor and the moisture-proof protective film.

* * * * *